US009752764B2

United States Patent
Cao et al.

(10) Patent No.: US 9,752,764 B2
(45) Date of Patent: Sep. 5, 2017

(54) WIDE-ANGLE EMITTING LED DRIVEN BY BUILT-IN POWER AND ASSEMBLY METHOD THEREOF

(71) Applicant: Ningbo Yamao Lighting Electric Appliance Company Ltd., Ningbo, Zhejiang (CN)

(72) Inventors: MaoJun Cao, Zhejiang (CN); Hui Chen, Zhejiang (CN); Wei Tan, Zhejiang (CN)

(73) Assignee: NINGBO YAMAO LIGHTING ELECTRIC APPLIANCE COMPANY LTD. (CN)

( * ) Notice: Subject to any disclaimer, the term of this patent is extended or adjusted under 35 U.S.C. 154(b) by 16 days.

(21) Appl. No.: 14/315,343

(22) Filed: Jun. 26, 2014

(65) Prior Publication Data
US 2015/0354796 A1    Dec. 10, 2015

(30) Foreign Application Priority Data

Jun. 4, 2014    (CN) .......................... 2014 1 0245851

(51) Int. Cl.
*F21V 23/00*    (2015.01)
*H05K 1/00*    (2006.01)
(Continued)

(52) U.S. Cl.
CPC .......... *F21V 23/005* (2013.01); *H01L 33/502* (2013.01); *H05K 1/00* (2013.01);
(Continued)

(58) Field of Classification Search
CPC ....... F21V 23/005; H05K 1/00; H01L 33/502; H01L 2924/0002; H01L 25/167;
(Continued)

(56) References Cited

U.S. PATENT DOCUMENTS

2005/0239227 A1* 10/2005 Aanegola ................ H01L 33/52
                                                              438/26
2008/0017870 A1*  1/2008 Diamantidis ............. F21K 9/00
                                                               257/81
(Continued)

FOREIGN PATENT DOCUMENTS

CN        103208578     *  7/2013
CN        103208578 A     7/2013
CN        103500786 A     1/2014

*Primary Examiner* — Steven Loke
*Assistant Examiner* — Juanita Rhodes
(74) *Attorney, Agent, or Firm* — Steven M. Greenberg; CRGO Law

(57) ABSTRACT

A wide-angle emitting LED driven by built-in power and an assembling method are provided. The wide-angle emitting LED includes a transparent substrate, at least one light-emitting chip, and a driving circuit component. The front of the transparent substrate is provided with a printed circuit where a portion of an upper surface of the transparent substrate is provided with a plurality of conductive bonding pads. Each of the at least one light-emitting chip is bonded on the front of the transparent substrate, and the at least one light-emitting chip is electrically connected to the conductive bonding pads by metal wires. In addition, the driving circuit component is bonded with the transparent substrate and the conductive bonding pads and is electrically connected to the conductive bonding pads by metal wires.

8 Claims, 2 Drawing Sheets

(51) Int. Cl.
*H01L 25/16* (2006.01)
*H01L 33/50* (2010.01)
*H05K 1/02* (2006.01)
*H05K 1/03* (2006.01)
*F21Y 101/00* (2016.01)
*F21Y 103/33* (2016.01)
*F21Y 115/10* (2016.01)
*H05K 1/18* (2006.01)
*H05K 3/34* (2006.01)

(52) U.S. Cl.
CPC ......... *H05K 1/0274* (2013.01); *H05K 1/0306* (2013.01); *F21Y 2101/00* (2013.01); *F21Y 2103/33* (2016.08); *F21Y 2115/10* (2016.08); *H01L 25/167* (2013.01); *H01L 2924/0002* (2013.01); *H05K 1/181* (2013.01); *H05K 3/3463* (2013.01); *H05K 2201/0108* (2013.01); *H05K 2201/10106* (2013.01)

(58) Field of Classification Search
CPC .... H01L 33/00–33/648; F21Y 2101/00; F21Y 2103/33
See application file for complete search history.

(56) References Cited

U.S. PATENT DOCUMENTS

| | | | | |
|---|---|---|---|---|
| 2008/0123198 | A1* | 5/2008 | Fujita | G02B 6/4206 359/709 |
| 2008/0164806 | A1* | 7/2008 | Chen | C09K 11/0883 313/503 |
| 2008/0315752 | A1* | 12/2008 | Rak | C09K 11/0883 313/503 |
| 2009/0046456 | A1* | 2/2009 | Urano | F21K 9/00 362/235 |
| 2009/0221783 | A1* | 9/2009 | Hawker | C08G 77/06 528/25 |
| 2009/0224280 | A1* | 9/2009 | Tsai | H01L 23/3121 257/99 |
| 2010/0059770 | A1* | 3/2010 | Hsu | H01L 25/0753 257/98 |
| 2011/0235355 | A1* | 9/2011 | Seko | F21S 48/1154 362/510 |
| 2012/0086024 | A1* | 4/2012 | Andrews | H01L 25/0753 257/88 |
| 2012/0120649 | A1* | 5/2012 | Catalano | F21V 29/83 362/231 |
| 2014/0016324 | A1* | 1/2014 | Hsin | F21V 23/005 362/293 |
| 2014/0193606 | A1* | 7/2014 | Kwong | C30B 29/20 428/138 |

* cited by examiner

WIDE-ANGLE EMITTING LED DRIVEN BY BUILT-IN POWER AND ASSEMBLY METHOD THEREOF

CROSS-REFERENCE TO RELATED APPLICATIONS

This application claims priority and benefit of Chinese Patent Application No. CN 201410245851.2, filed on Jun. 4, 2014, the entire content of which is herein incorporated by reference

BACKGROUND OF THE INVENTION

Embodiments of the present invention generally relate to the field of illumination, more specifically, to a wide-angle emitting LED driven by built-in power and assembly method thereof

DESCRIPTION OF THE RELATED ART

The incandescent light bulbs are used in the traditional lighting technologies, however, it is unable to meet the needs of modern society increasingly because of its large power consumption and bulk, low luminous efficiency and short life. With the development of semiconductor technology, LED (Light-emitting Diode, referred to as LED) applied in electric light technology attracts more and more people's attention, for which is low power consumption, small bulk, high luminous efficiency and long life.

With the development of technology, LED is widely used, especially LED power has been improved gradually, thereby LED's use extends to lighting filed from signal display, such as road lighting, tunnel lighting, industrial lighting and other high power lighting. Comparing with the traditional light source, LED has many unique advantages, such as small emitting point, easy optical design of it, high luminaire efficiency, thereby it has greater potential of energy saving than the traditional light source. In addition, it is more advantage for LED applied to road lighting, tunnel lighting, industrial lighting and other high power lighting because of its long life and good shock resistance, thereby it is widely used.

The LED chip is composed of two parts. One part is a P-type semiconductor which has a larger hole concentration than electron concentration; the other part is an N-type semiconductor which has a larger electron concentration than hole concentration. When the two semiconductor contact, there is a transition layer between P-type and N-type semiconductor, which is called as P-N junction in the industry. When a forward voltage is applied to the light-emitting diode, thus the current through the transistor, the electrons from N-type area pass through the P-N junction to P-type area, and the holes and the electrons recombine near P-N junction in the range of a few micrometers, thereby the photons are generated in P-N junction to emit energy, this is the basic principle of the LED luminous.

In general, metal and PCB (Printed Circuit Board) is made of the substrate of the lighting source in the conventional LED source, due to the limitation of metal and PCB, which is one-sided lighting and small emitting angle generally, leading to the optical power down and low utilization rate of bluechip in LED, thereby affecting the luminous efficiency of LED source.

Meanwhile, LED source is driven by the external power supply in prior art, so it has some limitations to practical application.

SUMMARY OF THE INVENTION

The invention generally includes a wide-angle emitting LED driven by built-in power capable of emitting light without the external connection to the driving power, achieving wide-angle emitting, the high efficiency of light emitting and the low power dissipation. One aspect of the invention is directed toward an assembly method for a wide-angle emitting LED driven by built-in power.

In one embodiment, a wide-angle emitting LED driven by built-in power is provided and includes a transparent substrate, at least one light-emitting chip, and a driving circuit component. The front of the transparent substrate is provided with a printed circuit, where a portion of an upper surface of the transparent substrate is provided with a plurality of conductive bonding pads. Each of the at least one light-emitting chip is bonded with the front of the transparent substrate, and the at least one light-emitting chip is electrically connected to the conductive bonding pads by metal wires. In addition, the driving circuit component is bonded with the transparent substrate and the conductive bonding pads, and the driving circuit component is electrically connected to the conductive bonding pads by metal wires.

In one aspect, the transparent substrate is a transparent alumina ceramic substrate formed by baking $\alpha\text{-Al}_2\text{O}_3$. In another aspect, the linear light transmittance of the transparent substrate is more than 10%, and the total light transmittance of the transparent substrate is more than 90%. In still another aspect, a transparent high-temperature resisting glue covers the printed circuit, and the transparent high-temperature resisting glue does not cover the upper surface of the conductive bonding pads.

In a further aspect, both the printed circuit and the conductive bonding pads are made of transparent conductive materials. In addition, each light-emitting chip can be bonded with the transparent substrate by transparent solid crystal glue. In still a further aspect, the driving circuit component comprises a driving IC chip, a rectifier diode chip and resistances. In still a further aspect, the rectifier diode chip and the resistances is bonded with the conductive bonding pads by solid crystal solder paste, and the driving IC chip is bonded with the transparent substrate by solid crystal solder paste.

In still a further aspect, the light-emitting chip is one of or a combination of red-ray emitting LED chip, green-ray emitting LED chip and blue-ray emitting LED chip, and each light-emitting chip is the transparent chip without reflecting layers. In still a further aspect, the front and back of the transparent substrate are coated with rare earth fluorescent silica gel for packaging, the rare earth fluorescent silica gel for packaging overlaps each light-emitting chip, and the rare earth fluorescent silica gel for packaging on the front of the transparent substrate covers the top of each light-emitting chip; the top of the driving circuit is coated with white IC silica gel for packaging.

Furthermore, the rare earth fluorescent silica gel can be self-forming gel. In one example, the rare earth fluorescent silica gel for packaging is made of red rare earth, green rare earth and silica gel. In another example, the viscosity of the rare earth fluorescent silica gel is more than 16000 mPa·s; and the mixing ratio of the red are earth, the green rare earth and the silica gel is 1:4:20.

Another embodiment of the invention provides a method for assembling the wide-angle emitting LED and includes providing a transparent substrate, wherein the front of the transparent substrate is provided with a printed circuit where a portion of an upper surface of the transparent substrate is provided with a plurality of conductive bonding pads, and bonding at least one light-emitting chip with the front of the transparent substrate. The method further includes bonding a driving circuit component with the transparent substrate and the conductive bonding pads, performing a first curing process, bonding the driving circuit component and the light-emitting chip with the conductive bonding pads by metal wires, coating a layer of rare earth fluorescent silica gel on both the front and the bake of the transparent substrate, coating a layer of an IC silica gel for packaging at the top of the driving circuit, performing a second curing process, and performing an electrical test and a packaging process.

In one aspect, the transparent substrate is a transparent alumina ceramic substrate formed by baking α-Al2O3. In another aspect, the linear light transmittance of the transparent substrate is more than 10%. In still another aspect, the total light transmittance of the transparent substrate is more than 90%. In one example, a transparent high-temperature resisting glue covers the printed circuit. In another example, the transparent high-temperature resisting glue does not cover the upper surface of the conductive bonding pads. In still another example, both the printed circuit and the conductive bonding pads are made of transparent conductive materials.

In another aspect, each light-emitting chip is bonded with the transparent substrate by transparent solid crystal glue. In still another aspect, the driving circuit component includes a driving IC chip, a rectifier diode chip and resistances.

In one example, both the rectifier diode chip and the resistances are bonded with the conductive bonding pads by solid crystal solder paste. In another example, the driving IC chip is bonded with the transparent substrate by solid crystal solder paste.

In a further aspect, the light-emitting chip is one of or a combination of red-ray emitting LED chip, green-ray emitting LED chip and blue-ray emitting LED chip, and each light-emitting chip is the transparent chip without reflecting layers. In one embodiment, the rare earth fluorescent silica gel for packaging overlaps each light-emitting chip, and the rare earth fluorescent silica gel for packaging on the front of the transparent substrate covers the top of each light-emitting chip.

In one example, the rare earth fluorescent silica gel is a self-forming gel. In another example, the rare earth fluorescent silica gel for packaging is made of red rare earth, green rare earth and silica gel.

In one embodiment, the viscosity of the rare earth fluorescent silica gel is more than 16000 mPa·s. In another embodiment, the mixing ratio of the red rare earth, the green rare earth and silica gel is 1:4:20.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
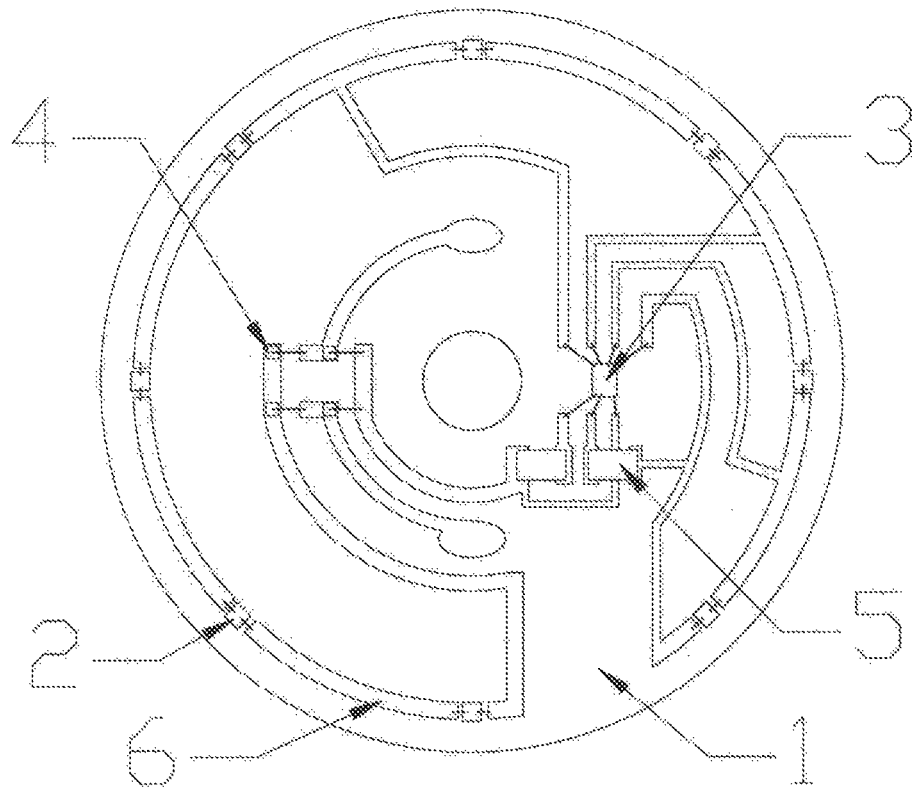
FIG. 1 is a top view of the LED which has been electrically connected by metal wires according to an embodiment of the present disclosure.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated. As used herein, the term "plurality" means a number greater than one. Hereinafter, certain exemplary embodiments according to the present disclosure will be described with reference to the accompanying drawings.

Embodiments of the invention includes a wide-angle emitting LED driven by built-in power capable of emitting light without the external connection to the driving power, thereby achieving wide-angle emitting, the high efficiency of light emitting and the low power dissipation. In addition, a method for assembling a wide-angle emitting LED driven by built-in power is provided. Transparent materials within the wide-angle emitting LED can save the energy consumption and can emit light without external drive module via the built-in driving component within the wide-angle emitting LED.

Embodiment 1

The present embodiment provides a wide-angle emitting LED driven by built-in power, As shown in FIG. 1 and FIG.

2, the LED comprises: ① a Transparent Substrate 1, the front of which is provided with a Printed Circuit 6 whose part of the upper surface is provided with a plurality of conductive bonding pads (not shown in Figures); ② at least one Light-Emitting Chip 2, each Light-Emitting Chip 2 being bonded with the front of Transparent Substrate 1, and Light-Emitting Chip 6 being electrically connected to the conductive bonding pads by metal wires; ③ a driving circuit component bonded with Transparent Substrate 1 and the conductive bonding pads, and the driving circuit component being electrically connected to the conductive bonding pads by metal wires.

In a preferred embodiment, Transparent Substrate 1 is a transparent alumina ceramic substrate. As the thermal conductivity of the transparent alumina ceramic substrate is high, the thermal stability of the transparent alumina ceramic substrate is good, the producing process of the transparent alumina ceramic substrate is simple, and the transparent alumina ceramic substrate is transparent, the stability of the material will be maintained and the light can be emitted from the LED in every direction, which improves the luminous efficiency of LED. More preferably, the transparent substrate is formed by baking $\alpha$-Al2O3. In the lattice of alpha type alumina, oxygen ions are packed closely to form the hexagonal structure, $Al_3^+$ is located symmetrically in the coordination center of the octahedron surround by oxygen ions, and the energy of the lattice is large. Hence, its melting point and boiling point is very high. Alpha type alumina, which is insoluble in water and acid, also known as the alumina in the industry, is the basic raw material for producing metal aluminum; moreover, it is also used for producing all kinds of refractory bricks, refractory crucible, the refractory tube and high temperature test instruments; moreover, it also can be used as polishing agent, flame retardant, filling materials and so on, and can be used in the production of modern large scale integrated circuit substrate. The alpha-$Al_2O_3$ material applied to the present invention can effectively make a cooling effect, to prolong the life of LED source, and to improve the stability of LED source in the long time work.

Meanwhile, in the present invention, the transparent substrate is formed by baking $\alpha$-$Al_2O_3$ whose linear transmittance is greater than 10%, and total transmittance is greater than 90%, which have beneficial effects on the wide-angle emitting, and improving the luminous efficiency and the luminous angle. The sintering process is known to the person skilled in the field. The person skilled in the field should be able to understand that the transparent substrate is formed by baking $\alpha$-Al2O3 in the present disclosure, which is just performed as a preferred embodiment; other transparent materials can also be used as the substrate.

In a preferred embodiment, both Printed Circuit 6 and the conductive bonding pads are made of transparent conductive materials, which improves the luminous efficiency and the luminous angle of the LED. In addition, a transparent high-temperature resisting glue covers Printed Circuit 6, meanwhile, the transparent high-temperature resisting glue does not cover the upper surface of the conductive bonding pads. Hence, the space for placing the device connecting to the conductive bonding pads is reserved, and the electrical connection between the conductive bonding pads and the device will not be affected. Moreover, the use of the transparent high-temperature resisting glue will improve the luminous efficiency and the luminous angle of the LED and prolong the service life of the LED.

In a preferred embodiment, Light-Emitting Chip 2 is one of or a combination of red-ray emitting LED chip, green-ray emitting LED chip and blue-ray emitting LED chip. The specific choice of the light-emitting chip is based on the actual requirement, for example, choosing one LED chip or a plurality of LED chips with the same color or a combination of several LED chips selected from the red-ray emitting LED chips, the green-ray emitting LED chips and the blue-ray emitting LED chips. More preferably, Light-Emitting Chip 2 provided by the invention is the three-dimensional luminous transparent chip without reflecting layers, which maximizes the luminous efficiency of Light-Emitting Chip 2. More preferably, each light-emitting chip is not connected to Printed Circuit 6; in some embodiments, Printed Circuit 6 is provided with a plurality of fractures, Light-Emitting Chip 2 is fixed on the fracture of Transparent Substrate 1. Meanwhile, the bonding area of Light-Emitting Chip 2 is controlled according to the process requirement. As shown in FIG. 1, for example, the area surround by Light-Emitting Chips 2 is annular, however, according to the process requirements, it also can be arranged in other shapes comprising regular shapes, such as rectangle and star, and irregular shapes.

In a preferred embodiment, the circuit driven by built-in power comprises a Driving IC Chip 3, a Rectifier Diode Chip 4 and Resistance 5. Due to the circuit formed by combining Drive IC Chip 3, Rectifier Diode Chip 4 and Resistance 5, the light emitting of the LED is achieved without connecting an external driving circuit. More preferably, Drive IC Chip 3 is the drive IC chip with constant current.

In a preferred embodiment, Rectifier diode chip 4 and Resistance 5 are bonded with the conductive bonding pads by solid crystal solder paste, and Drive IC Chip 3 is bonded with Transparent Substrate 1 by solid crystal solder paste. The reason for adopting solid crystal solder paste is that the bonding material of the solid crystal solder paste is metal allay, such as SnAgCu, whose thermal conductivity is 40 W/MK. The solid crystal solder paste can not only meets the environmental standards, such as RoHS and halogen-free, but also achieve the good fusion between metals when being applied to the packaging of LED chips. Moreover, the thermal resistance of heat dissipation channel in the LED can be reduced, the better conductivity and bonding strength can be achieved, as well as the lower empty rate. When the solid crystal solder paste is used for the bonding in the circuit, the circuit will have better thermal conductivity, which will alleviate the cooling bottleneck of high power LED, improves the reliability of LED, and prolong the service life of LED. Meanwhile, the cost of the solid crystal solder paste is much lower than silver paste, silver-paste adhesive or other bonding materials of the high power LED, and the energy consumption is low in the solid crystal process, which has beneficial effects on lowering producing cost.

In a preferred embodiment, the front and back of Transparent Substrate 1 are coated with Rare Earth Fluorescent Silica Gel For Packaging 7, and the top of the driving circuit is coated with white IC Silica Gel For Packaging 8; wherein, Rare Earth Fluorescent Silica Gel For Packaging 7 overlaps each Light-Emitting Chip 2 vertically, and Rare Earth Fluorescent Silica Gel For Packaging 7 located on the front of Transparent Substrate 1 covers the top of each Light-Emitting Chip 2. More preferably, Rare Earth Fluorescent Silica Gel For Packaging 7 is self-forming molding silica gel which mainly includes red rare earth, green rare earth and silica gel, and the viscosity Rare Earth Fluorescent Silica Gel For Packaging 7 is higher than 16000 mPa·s, which brings out a good adhesion effect. In a preferred embodiment, the mixing ratio of the red rare earth, the green rare earth and silica gel is 1:4:20. As the front and the back of Light-Emitting Chip 2 are coated with Rare Earth Fluorescent Silica Gel For Packaging 7, when the Light-Emitting Chip 2 emits light, the hue of the emitted light can be adjusted by utilizing Rare Earth Fluorescent Silica Gel For Packaging 7. For instance, when the mixing ratio of the red rare earth, the green rare earth and silica gel is 1:4:20, and the blue-ray emitting LED chip is adopted, white light will be emitted. The hue of the emitting light can be changed by adjusting the mixing ratio of the red rare earth in Rare Earth Fluorescent Silica Gel For Packaging 7 according to the requirement.

The LED provided by the present disclosure can achieve 360 degree wide-angle emitting, the luminous efficiency of which is 50% higher than the traditional LED; meanwhile, due to having the built-in driving components, it can emit light without external driving module, which is used widely.

In a preferred embodiment, the blue LED chip is used as the light-emitting chip, where the mixing ratio of the red rare earth, the green rare earth and silica gel is 1:4:20, the test result of the light-emitting chip will be: color temperature Tc=2896K, color rendering index Ra=80.3, luminous efficiency: 115.2 Lm/W, thereby the luminous efficiency is improving greatly compared to the traditional LED.

Embodiment 2

Figure 2:
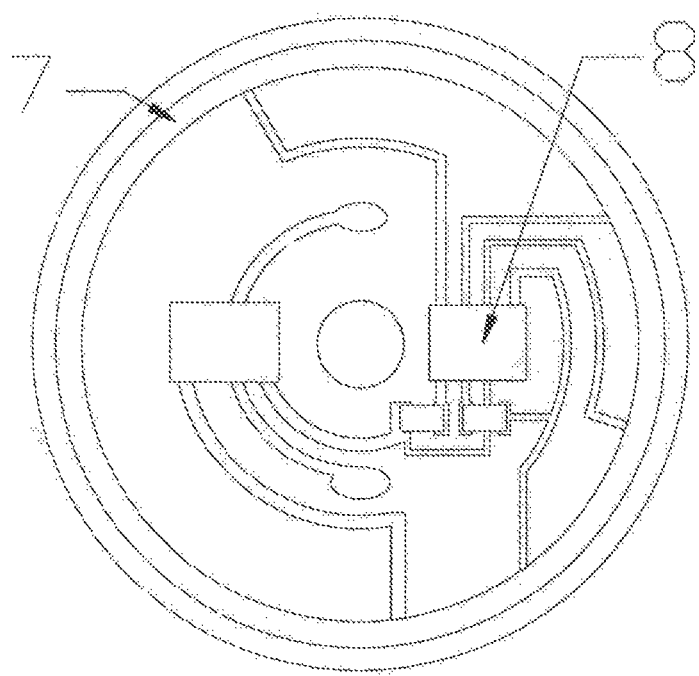
FIG. 2 is a top view of the LED source which has been coated with rare earth fluorescent silica gel for packaging and IC silica gel for packaging according to an embodiment of the present disclosure.
Figure 3:
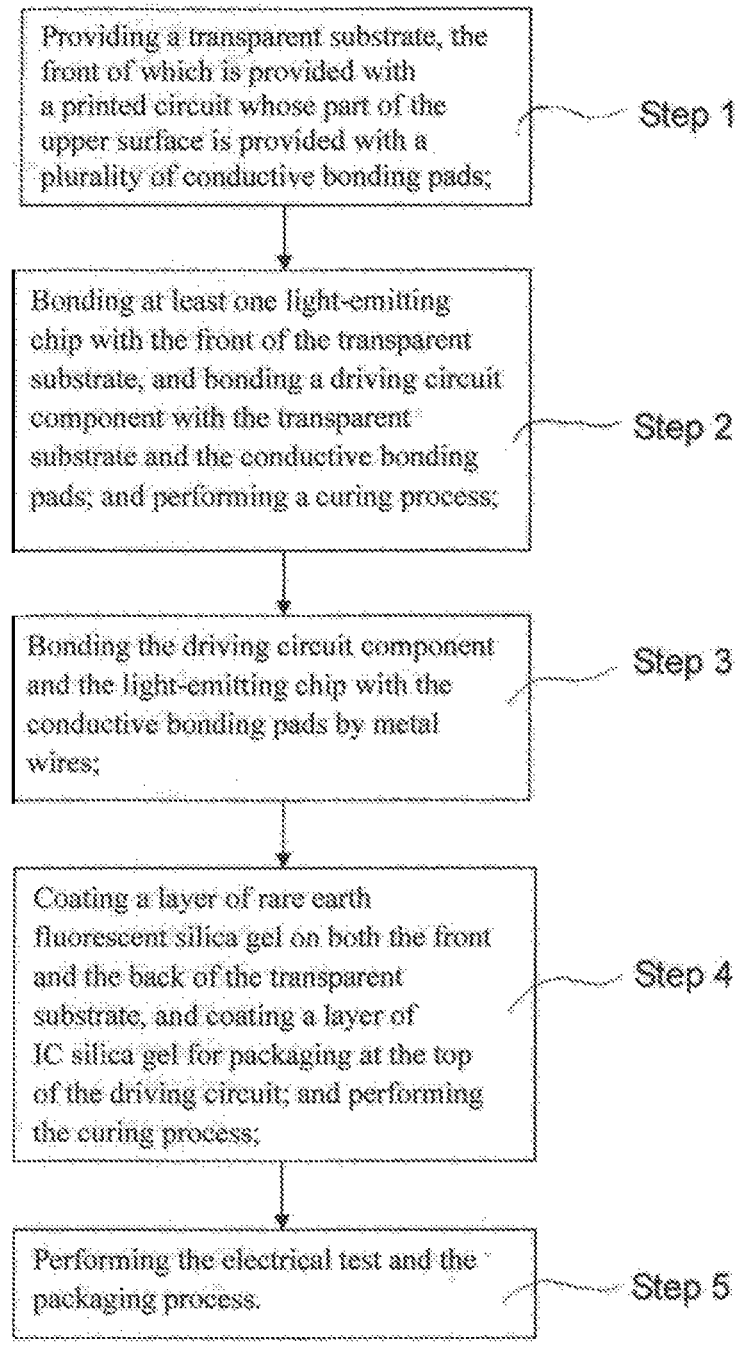
FIG. 3 is a flow chart for producing the LED in the present disclosure.

The present embodiment provides an assembly method of a wide-angle emitting LED driven by built-in power, as shown in FIGS. 1 to 3. The method includes one or more of the following steps:

Step 1: providing a transparent substrate, wherein the front of the transparent substrate is provided with a printed circuit where a portion of its upper surface is provided with a plurality of conductive bonding pads.

In a preferred embodiment, a Transparent Substrate 1 is a transparent alumina ceramic substrate. As the thermal conductivity of the transparent alumina ceramic substrate is high, the thermal stability of the transparent alumina ceramic substrate is good, the producing process of the transparent alumina ceramic substrate is simple, the cost of production is low. As the transparent alumina ceramic substrate is transparent, the stability of the material will be maintained and the light can be emitted from the LED in every direction, which improves the luminous efficiency of LED.

More preferably, the transparent substrate is formed by baking α-Al2O3. In the lattice of alpha type alumina, oxygen ions are packed closely to form the hexagonal structure, $Al_3^+$ is located symmetrically in the coordination center of the octahedron surround by oxygen ions, and the energy of the lattice is large. Hence, its melting point and boiling point is very high. Alpha type alumina, which is insoluble in water and acid, also known as the alumina in the industry, is the basic raw material for producing metal aluminum; moreover, it is also used for producing all kinds of refractory bricks, refractory crucible, the refractory tube and high temperature test instruments; moreover, it also can be used as polishing agent, flame retardant, filling materials and so on, and can be used in the production of modern large scale integrated circuit substrate. The α-$Al_2O_3$ material applied to the present invention can effectively make a cooling effect, to prolong the life of LED source, and to improve the stability of LED source in the long time work.

Meanwhile, in the present invention, the transparent substrate is formed by baking α-$Al_2O_3$ whose linear transmittance is greater than 10%, and total transmittance is greater than 90%, which have beneficial effects on the wide-angle emitting, and improving the luminous efficiency and the luminous angle. The sintering process is known to the person skilled in the field. The person skilled in the field should be able to understand that the transparent substrate is formed by baking α-Al2O3 in the present disclosure, which is just performed as a preferred embodiment; other transparent materials can also be used as the substrate.

In a preferred embodiment, both Printed Circuit 6 and the conductive bonding pads are made of transparent conductive materials, which improves the luminous efficiency and the luminous angle of the LED. In addition, a transparent high-temperature resisting glue covers Printed Circuit 6, meanwhile, the transparent high-temperature resisting glue does not cover the upper surface of the conductive bonding pads. Hence, the space for placing the device connecting to the conductive bonding pads is reserved, and the electrical connection between the conductive bonding pads and the device will not be affected. Moreover, the use of the transparent high-temperature resisting glue will improve the luminous efficiency and the luminous angle of the LED and prolong the service life of the LED.

Step 2: bonding at least one Light-Emitting Chip 2 with the front of Transparent Substrate 1, and bonding a driving circuit component with the transparent substrate and the conductive bonding pads; and performing a curing process.

In a preferred embodiment, Light-Emitting Chip 2 is one of or a combination of red-ray emitting LED chip, green-ray emitting LED chip and blue-ray emitting LED chip. The specific choice of the light-emitting chip is based on the actual requirement, for example, choosing one LED chip or a plurality of LED chips with the same color or a combination of several LED chips selected from the red-ray emitting LED chips, the green-ray emitting LED chips and the blue-ray emitting LED chips. More preferably, Light-Emitting Chip 2 provided by the invention is the transparent chip without reflective layers, and each Light-Emitting Chip 2 is fixed on Transparent Substrate 1 by transparent solid crystal solder paste, hence, the luminous efficiency and the light-emitting angle of Light-Emitting Chip 2 can be improved. Meanwhile, the bonding area of Light-Emitting Chip 2 is controlled according to the process requirement. As shown in FIG. 1, for example, the area surround by Light-Emitting Chips 2 is annular, however, according to the process requirements, it also can be arranged in other shapes comprising regular shapes, such as rectangle and star, and irregular shapes.

In a preferred embodiment, the circuit driven by built-in power comprises a Drive IC Chip 3, a Rectifier Diode Chip 4 and Resistance 5. Rectifier Diode Chip 4 and Resistance 5 are bonded with the conductive bonding pads by solid crystal solder paste, and Drive IC Chip 3 is bonded with Transparent Substrate 1 by solid crystal solder paste. The reason for adopting solid crystal solder paste is that the bonding material of the solid crystal solder paste is metal alloy, such as SnAgCu, whose thermal conductivity is 40 W/M·K. The solid crystal solder paste can not only meets the environmental standards, such as RoHS and halogen-free, but also achieve the good fusion between metals when being applied to the packaging of LED chips. Moreover, the thermal resistance of heat dissipation channel in the LED can be reduced, the better conductivity and bonding strength can be achieved, as well as the lower empty rate. When the solid crystal solder paste is used for the bonding in the circuit, the circuit will have better thermal conductivity, which will alleviate the cooling bottleneck of high power LED, improves the reliability of LED, and prolong the service life of LED. Meanwhile, the cost of the solid crystal solder paste is much lower than silver paste, silver adhesive, silver paste or other bonding materials of the high power LED, and the energy consumption is low in the solid crystal process, which has beneficial effects on lowering producing cost.

After performing the bonding process of the driving circuit component and Light-Emitting Chip 2, performing a curing process to fix Light-Emitting Chip 2, Driving IC Chip 3, Rectifier Diode Chip 4 and Resistances 5. In one embodiment, the transparent solid crystal glue and the solid crystal solder paste is cured by the oven baking. In another embodiment, the transparent solid crystal glue and the solid crystal solder paste is cured by microwave radiation or ultraviolet radiation.

Step 3: bonding the Driving IC Chip 3 component and the Light-Emitting Chip 2 with the conductive bonding pads by metal wires.

In a preferred embodiment, Light-Emitting Chip 2, Driving IC Chip 3 and Rectifier Diode Chip 4 in the driving circuit may electrically connect to the conductive bonding pads respectively by golden wires in the welding wire machine, so as to achieve the circuit operation.

Step 4: coating a layer of Rare Earth Fluorescent Silica Gel For Packaging 7 on both the front and the bake of the transparent substrate, and coating a layer of IC Silica Gel For Packaging 8 at the top of the driving circuit; and performing a first curing process.

In a preferred embodiment, Rare Earth Fluorescent Silica Gel For Packaging 7 overlaps each Light-Emitting Chip 2, and Rare Earth Fluorescent Silica Gel For Packaging 7 located on the front of Transparent Substrate 1 covers the top of each Light-Emitting Chip 2.

More preferably, Rare Earth Fluorescent Silica Gel For Packaging 7 is self-forming molding silica gel which mainly includes silica gel, red-colored substance comprising rare earth elements, and green-colored substance comprising rare earth elements and silica gel, and the viscosity Rare Earth Fluorescent Silica Gel For Packaging 7 is higher than 16000 mPa·s, which brings out a good adhesion effect. In a preferred embodiment, the mixing ratio of the red: colored substance rare earth, the green-colored substance rare earth and silica gel is 1:4:20. As the front and the back of Light-Emitting Chip 2 are coated with Rare Earth Fluorescent Silica Gel For Packaging 7, when the Light-Emitting Chip 2 emits light, the hue of the emitted light can be adjusted by utilizing Rare Earth Fluorescent Silica Gel For Packaging 7. For instance, when the mixing ratio of the red-colored substance comprising rare earth elements, the green-colored substance comprising rare earth elements and silica gel is 1:4:20, and the blue-ray emitting LED chip is adopted, white light will be emitted. The hue of the emitting light can be changed by adjusting the mixing ratio of the red-colored substance comprising rare earth elements in Rare Earth Fluorescent Silica Gel For Packaging 7 according to the requirement.

When the above process is completed, performing a second curing process.

Step 5: performing an electrical test and a packaging process.

Accordingly, the LED provided by the present disclosure adopts the above technical scheme, namely, the transparent material is applied to the LED, which can effectively improve the luminous efficiency and the luminous angle of the LED, so it can achieve 360 degree wide-angle emitting, and save the energy consumption to some extent; meanwhile, due to having the built-in driving component, it can emit light without external drive module, which is used widely.

While the foregoing is directed to embodiments of the present invention, other and further embodiments of the invention may be devised without departing from the basic scope thereof, and the scope thereof is determined by the claims that follow.

The invention claimed is:

1. A wide-angle emitting LED, comprising:
a transparent substrate, a front of the transparent substrate is provided with a printed circuit where a portion of an upper surface of the transparent substrate is provided with a plurality of conductive bonding pads;
at least one light-emitting chip, wherein each light-emitting chip of the at least one light-emitting chip is bonded with the front of the transparent substrate, and wherein the light-emitting chip being electrically connected to the conductive bonding pads by metal wires; and
a driving circuit component bonded with the transparent substrate and the conductive bonding pads, wherein the driving circuit component is electrically connected to the conductive bonding pads by metal wires;
the bonding of the each light-emitting chip of the at least one light-emitting chip with the front of the transparent substrate by transparent solid crystal glue and the electrical connection of the each light-emitting chip of the at least one light-emitting chip to the conductive bonding pads and the bonding of the driving circuit component with the transparent substrate and the conductive bonding pads regulating a location of the driving circuit component and the each light-emitting chip of the at least one light-emitting chip and enhancing an adhesive strength of the driving circuit component and the each light-emitting chip of the at least one light-emitting chip;
wherein each light emitting chip of the at least one light-emitting chip is transparent and both the printed circuit and the conductive bonding pads are made of transparent conductive materials and the printed circuit is provided with a plurality of fractures and each light-emitting chip of the at least one light-emitting chips is fixed on a respective fracture of the plurality of fractures of the transparent substrate.

2. The wide-angle emitting LED of claim 1, wherein the transparent substrate is a transparent alumina ceramic substrate formed by baking $\alpha\text{-}Al_2O_3$.

3. The wide-angle emitting LED of claim 1, wherein a transparent high-temperature resisting glue covers the printed circuit, and the transparent high-temperature resisting glue does not cover an upper surface of the conductive bonding pads.

4. The wide-angle emitting LED of claim 1, wherein the driving circuit component comprises a driving IC chip, a rectifier diode chip and resistances.

5. The wide-angle emitting LED of claim 4, wherein the rectifier diode chip and the resistances is bonded with the conductive bonding pads by solid crystal solder paste, and the driving IC chip is bonded with the transparent substrate by solid crystal solder paste.

6. The wide-angle emitting LED of claim 1, wherein the at least one light-emitting chip is selected from a group consisting of a red-ray emitting LED chip, a green-ray emitting LED chip, a blue-ray emitting LED chip, and combinations thereof, and wherein each light-emitting chip is a transparent chip of the at least one light-emitting chip without reflecting layers.

7. The wide-angle emitting LED of claim 1, wherein the front and a back of the transparent substrate are coated with rare earth fluorescent silica gel for packaging, wherein the rare earth fluorescent silica gel for packaging overlaps each light-emitting chip of the at least one light-emitting chip, and wherein the rare earth fluorescent silica gel for packaging on the front of the transparent substrate covers a top of each light-emitting chip of the at least one light-emitting chip, and a top of the driving circuit component is coated with white IC silica gel for packaging.

8. The wide-angle emitting LED as disclosed in claim 7, wherein the rare earth fluorescent silica gel for packaging is comprised of red-colored substance comprising rare earth elements, green-colored substance comprising rare earth elements and silica gel; and a mixing ratio of the red-colored substance, the green-colored substance and the silica gel is 1:4:20.

* * * * *